Sept. 21, 1971 N. WASSERMAN 3,606,678

METHOD FOR MAKING A FERREED SWITCH HAVING PRINTED CIRCUIT BOARD

Original Filed May 28, 1968 8 Sheets-Sheet 1

INVENTOR
N. WASSERMAN
BY [signature]
ATTORNEY

METHOD FOR MAKING A FERREED SWITCH HAVING PRINTED CIRCUIT BOARD

Original Filed May 28, 1968

3,606,678

METHOD FOR MAKING A FERREED SWITCH HAVING PRINTED CIRCUIT BOARD WIRING

Norman Wasserman, Columbus, Ohio, assignor to Bell Telephone Laboratories, Incorporated, Murray Hill and Berkeley Heights, N.J.

Original application May 28, 1968, Ser. No. 732,608, now Patent No. 3,500,267. Divided and this application July 31, 1969, Ser. No. 871,076
Int. Cl. H05k 3/30
U.S. Cl. 29—626 4 Claims

ABSTRACT OF THE DISCLOSURE

A ferreed switch is disclosed in which a shunt plate assembly wired in a standard pattern, partially assembled by simultaneously positioning all of the reed switches with a magnetic jig, and located between two printed circuit boards is housed in a protective cover and equipped with lever arms adapted to facilitate installation in an operating environment. The shunt plate assembly and printed circuit boards are assembled so that at each crosspoint a coil support in the shunt plate assembly is in register with a set of small holes in one printed circuit board and a large hole in the other. Moreover, each coil support is sealed at one end, internally divided into compartments by a separator, and perforated by a lead hole in each compartment. Fnally, each reed switch in the coil supports is located in a separate compartment, has been positioned so that its airgap is in register with a magnetically, conducting portion of the shunt plate assembly, has one lead extending through a lead hole in the coil support to a point of attachment in a small hole in one printed circuit board, and has the other lead extending through a large hole in the other printed circuit board to a point of attachment with a flexible locating tab.

BACKGROUND OF THE INVENTION

Field of the invention

This application is a division of patent application Ser. No. 732,608, filed May 28, 1968, now Pat No. 3,500,267 and relates to crosspoint switching devices and pertains in particular to those in which the crosspoint connections are made through one or more sealed contact reed switches. Such devices are commonly referred to as ferreed switches.

Description of the prior art

Functionally, a ferreed switch is an interface device for making electromechanical switching apparatus compatible with electronic control equipment. The unique characteristic of a ferreed switch is its ability to accept instructions at microsecond rates and to convert those instructions into actions which require milliseconds to complete. By exploiting this characteristic, switching systems can be constructed in which the reliability of mechanical switching is combined with the versatility of high-speed control equipment.

More particularly, ferreed switches use the remanent characteristic of certain magnetic materials in order to produce a bistable switching function is selected reed switches. Structurally, the heart of a ferreed switch is a shunt plate assembly which is divided into a number of crosspoints. The switching function of each crosspoint is performed by a group of reed switches assembled in a cluster by a coil form. All of the coil forms are mounted in apertures in the shunt plate assembly, and each contains remanent members or plates which hold the reed switches in the cluster open or closed in response to magnetic flux generated by coincident control pulses.

Typically, the coil forms are distributed on the shunt plate assembly in a symmetrical array of rows and columns. Thus, a crosspoint is located at the intersection of each row and column. The operating windings in each row and in each column are wired in series and, when a potential is applied to a row or column, all of the operating coils generate control pulses. When a potential is applied to a row and column simultaneously, the coincident control pulses generated at the intersection produce a resultant operative magnetic flux to which the reed switches respond. In short, the typical ferreed switch is a magnetically operated crosspoint device in which the operative part of each crosspoint is a cluster of reed switches, and in which selective operation of the clusters occurs in response to magnetic flux produced by coincident control pulses appearing at the intersection between a row and column of operating coils.

While ferreed switches have proven to be extremely valuable and useful devices from a functional point of view, they nevertheless present a number of practical difficulties. For example, fabrication is a delicate and demanding task. As a specific example, when the reed switches are installed in a ferreed switch, the airgap in each must be located in a predetermined position with respect to the magnetically conducting portion of the shunt plate assembly. While many techniques for locating the reed switches have been devised, none has proved to be entirely satisfactory. Accordingly, one object of this invention is to facilitate the location of reed switches in the shunt plate assembly of a ferreed switch during fabrication.

Similarly, many times during the course of manufacture, the seals between the glass envelopes and the leads of the reed switches are subjected to undesirable mechanical stress. As a consequence, difficult-to-detect fractures or cracks occur in the seals which, in turn, often lead to the neessity of replacing an entire switch. Accordingly, another object of this invention is to relieve mechanical stresses inadvertently applied to seals in the reed switches during manufacture.

Another difficulty, although not entirely related to manufacturing, is the need to provide ferreed switches with the variety of switching functions demanded by circuit designers. Heretofore, in order to meet that demand, it has been necessary to maintain a supply of shunt plate assemblies in which each is wired differently. This practice, however, has proved to be both costly and inefficient. It is, therefore, another object of this invention to increase the versatility of the basic ferreed switch.

Ferreed switches, while relatively rugged devices, nevertheless contain delicate and sensitive parts. Consequently, they must be shielded in use. At the same time, however, the ferreed switch must be easy to install and remove. Accordingly, another object of this invention is to provide a ferreed switch that is easy to use but which is relatively safe from physical harm.

Further, in the use of ferreed switches, careful attention must be paid to maintenance details in order to keep operating cost at reasonable levels. In particular, the burgeoning use of ferreed switches demands elimination of techniques which were merely inconvenient on a limited use basis but which, on a large scale, are prohibitively wasteful and expensive. As one example, reed switches have heretofore been assembled in the coil forms so that each cluster becomes a unitary assembly. Thus, replacement of defective reed switches on an individual basis has been awkward, if not impossible. As a practical matter, therefore, when an individual switch fails, it is not replaced. Instead, an entirely new cluster is substituted for the one containing the defective switch. While such a solution may be permissible where limited quantities of ferreed switches are used, it is intolerable where the switches are used in volume. It is, therefore, another object of this invention to improve maintenance procedures.

In addition, circuit applications often require switching of signals of relatively high frequency. In such cases, ferreed switches behave as transmission lines and are susceptible to severe deterioration in signal carrying capacity. Another object of this invention, therefore, is to improve the behavior of a ferreed switch when it carries high frequency signals.

SUMMARY OF THE INVENTION

The foregoing objects of this invention and others of a similar nature are achieved by one or more of the following features.

In accordance with one feature of this invention all of the reed switches in the ferreed switch are simultaneously aligned during assembly with a magnetic referencing jig to facilitate manufacture.

In accordance with another feature of this invention, flexible tabs are attached to the lead ends of the reed switches in order to absorb undesirable mechanical stress imposed on the glass seals of the reed switches during fabrication.

In accordance with another feature of this invention each coil form is sealed at one end except for lead holes, and is internally divided into compartments to facilitate assembly of reed switches during fabrication and to facilitate removal of individual reed switches for maintenance purposes.

In accordance with another feature of this invention, at each crosspoint one circuit board is equipped with hole sets for positioning and holding individual reed switch leads, and the other circuit board is equipped with windows large enough to permit passage of an entire reed switch as well as to accommodate in a common opening all of the leads of reed switches in a cluster in order to facilitate fabrication and maintenance.

In accordance with another feature of this invention, lever arms are mounted on the ferreed switch for limiting the depth it may be inserted freely into a mounting position and for assisting in final insertion, and a protective housing having two cover halves is mounted on the ferreed switch in order to facilitate handling.

In accordance with another feature of this invention, each printed circuit board acts as a strip line to improve signal transmission at high frequency and comprises a grounded metal plate separated from the circuit paths by a dielectric material.

BRIEF DESCRIPTION OF THE DRAWING

The following detailed description will assist in a better understanding of this invention when taken in conjunction with the drawing in which.

DETAILED DESCRIPTION

Figure 1:
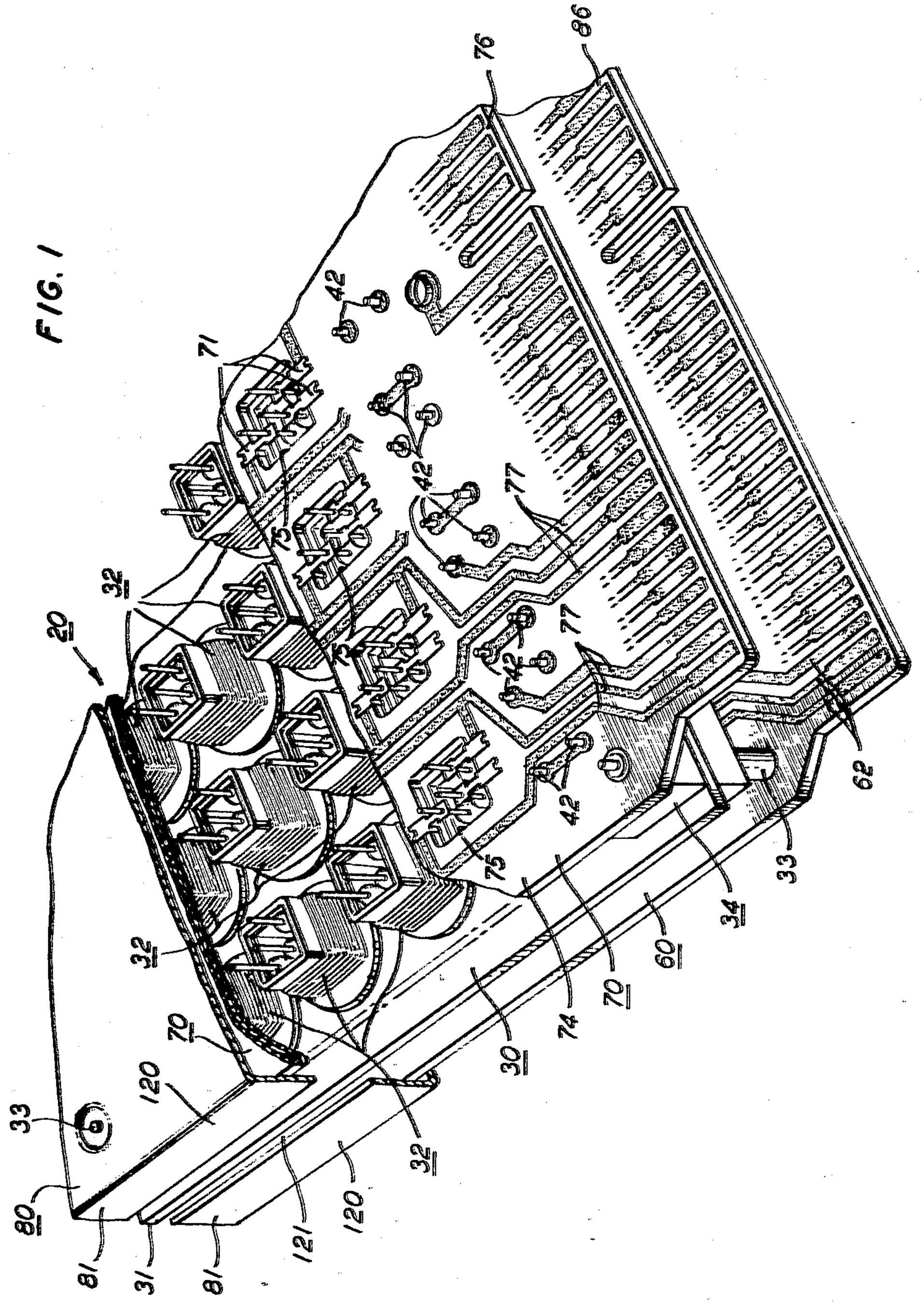
FIG. 1 is a partial view taken in perspective of a ferreed switch made in accordance with this invention and in which parts have been broken away to illustrate interior details.

A ferreed switch 20, as shown in FIG. 1, comprises a shunt plate assembly 30, two printed circuit boards 60 and 70, and a cover assembly 80. In the following paragraphs each of these elements is described in detail.

Figure 2:
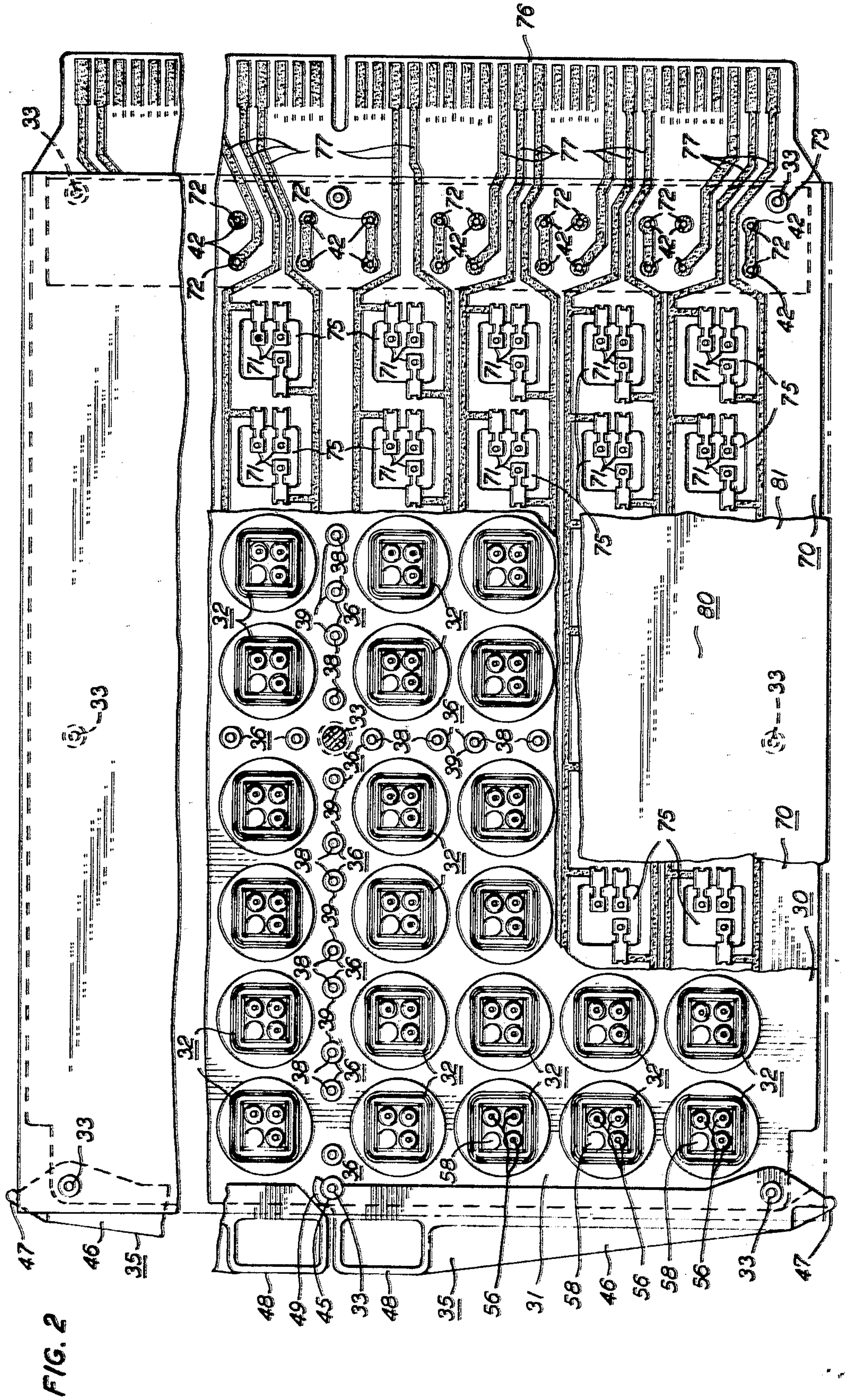
FIG. 2 is a partial plan view of the ferreed switch shown in FIG. 1 in which parts are broken away to illustrate interior details.
Figure 3:
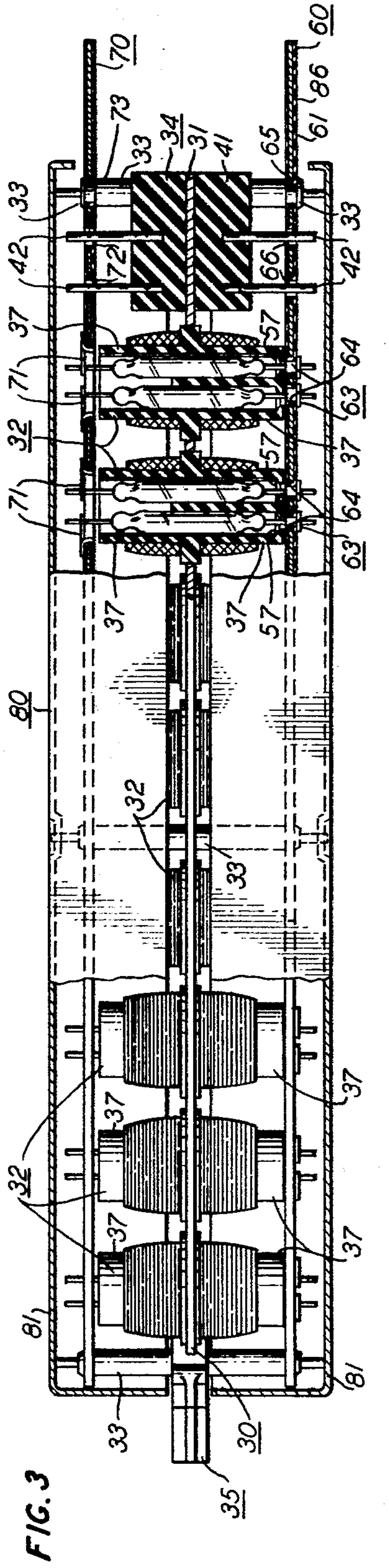
FIG. 3 is an elevation view of the ferreed switch shown in FIG. 2 taken partially in section and having parts broken away to illustrate interior details.

Beginning with the shunt plate assembly 30, it comprises, as best seen in FIGS. 2 and 3, a shunt plate 31, coil forms 32, stand-offs 33, a terminal block 34, lever arms 35, and a number of pass-through terminals 36. As partially shown in FIGS. 2 and 3, the coil forms 32 and the pass-through terminals 36 are arranged on the shunt plate 31 in a symmetrical array, while the terminal block 34 is located at one end and the lever arms 35 at the other end.

The shunt plate 31 performs a magnetic shunting function as described elsewhere and, in the embodiment illustrated, the coil form array comprises sixty-four coil forms 32 arranged in rows and columns of eight each to produce a configuration commonly referred to as an 8 x 8 matrix. Each coil form 32 has two end sections 37 and, as best seen in FIG. 3, is mounted in an aperture in the shunt plate 31 so that the end sections 37 project outwardly from both sides. Advantageously, the shunt plate 31 is made of a magnetically conducting material such as low remanent iron.

The embodiment of the shunt plate 31 disclosed herein contains thirty-two pass-through terminals 36. Each pass-through terminal 36 is essentially a post which extends through the shunt plate 31 so as to have its ends projecting outwardly a spaced distance from the surface thereof. As partially illustrated in FIG. 2, all thirty-two pass-through terminals 36 are arranged so as to divide the shunt plate 31 into quadrants containing sixteen coil forms 32 each. Each pass-through terminal 36 includes a metallic, electrically conducting pass-through pin 38 and an insulator sleeve 39. The insulator sleeve 39 electrically insulates the pass-through pin 38 and joins the pass-through terminal 36 to the shunt plate 31. Functionally, each pass-through pin 38 serves as an anchoring point for coil leads and as an electrically common point which extends from one side of the shunt plate 31 to the other.

The terminal block 34 serves as another anchoring point for coil leads and, as shown in FIG. 3, is conveniently located at one end of the shunt plate 31. It is rigidly attached, i.e., by rivets (not shown) and includes an insulating block 41 and a number of terminal pins 42. The terminal pins 42 are mounted on opposite sides of the insulating block 41 in parallel rows and each row contains sixteen pins. As can be seen in FIG. 3, the terminal pins 42 do not extend completely through, so the insulating block 41 contains sixty-four individual terminal pins 42. The insulating block 41 is advantageously made of a material such as a general purpose phenolic while the terminal pins 42 are made of an electrically conducting material such as tin-plated brass.

Figure 4:
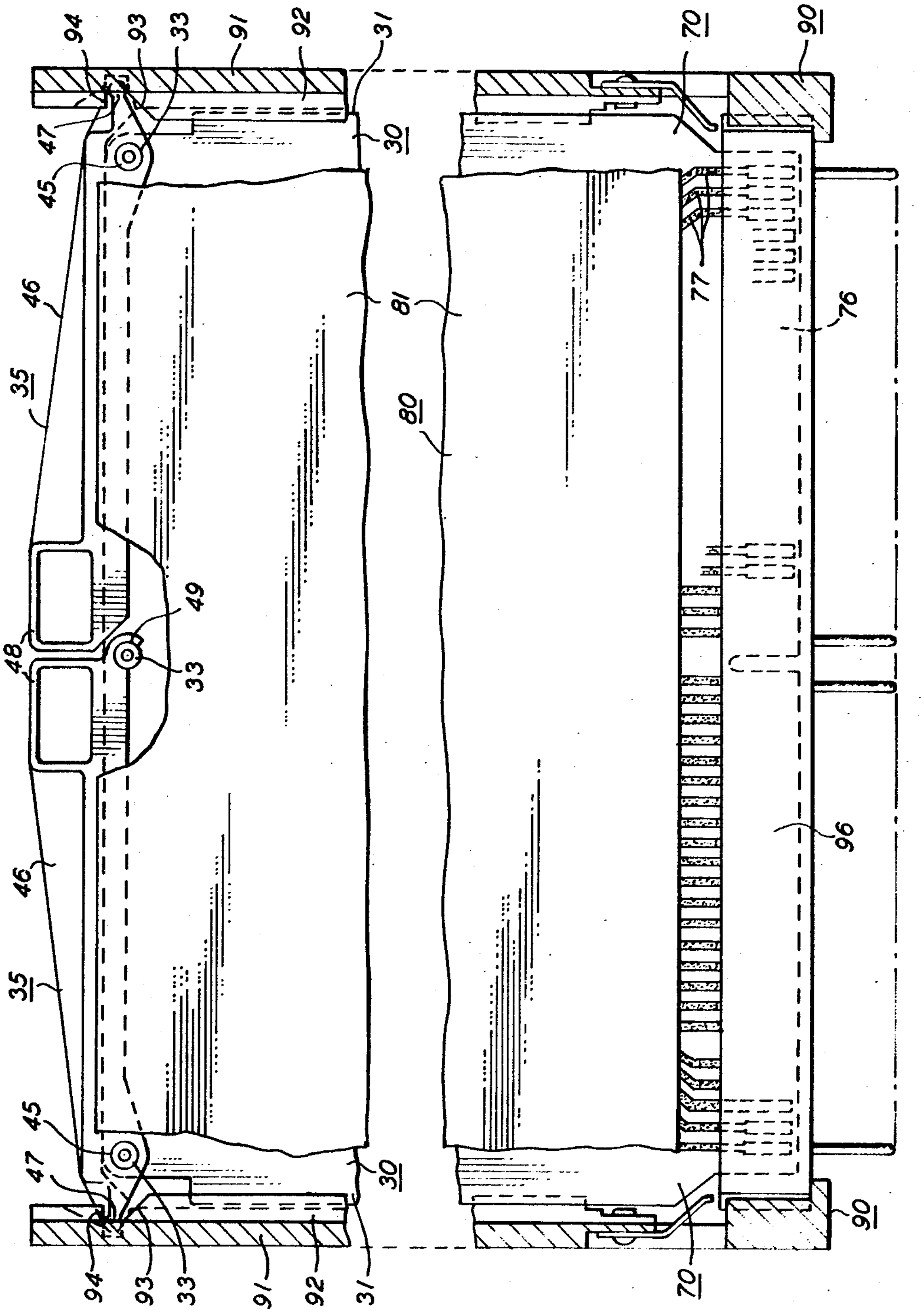
FIG. 4 is a partial plan view of the exterior of the ferreed switch shown in FIG. 2 and in which portions are broken away for illustrative purposes.
Figure 11:
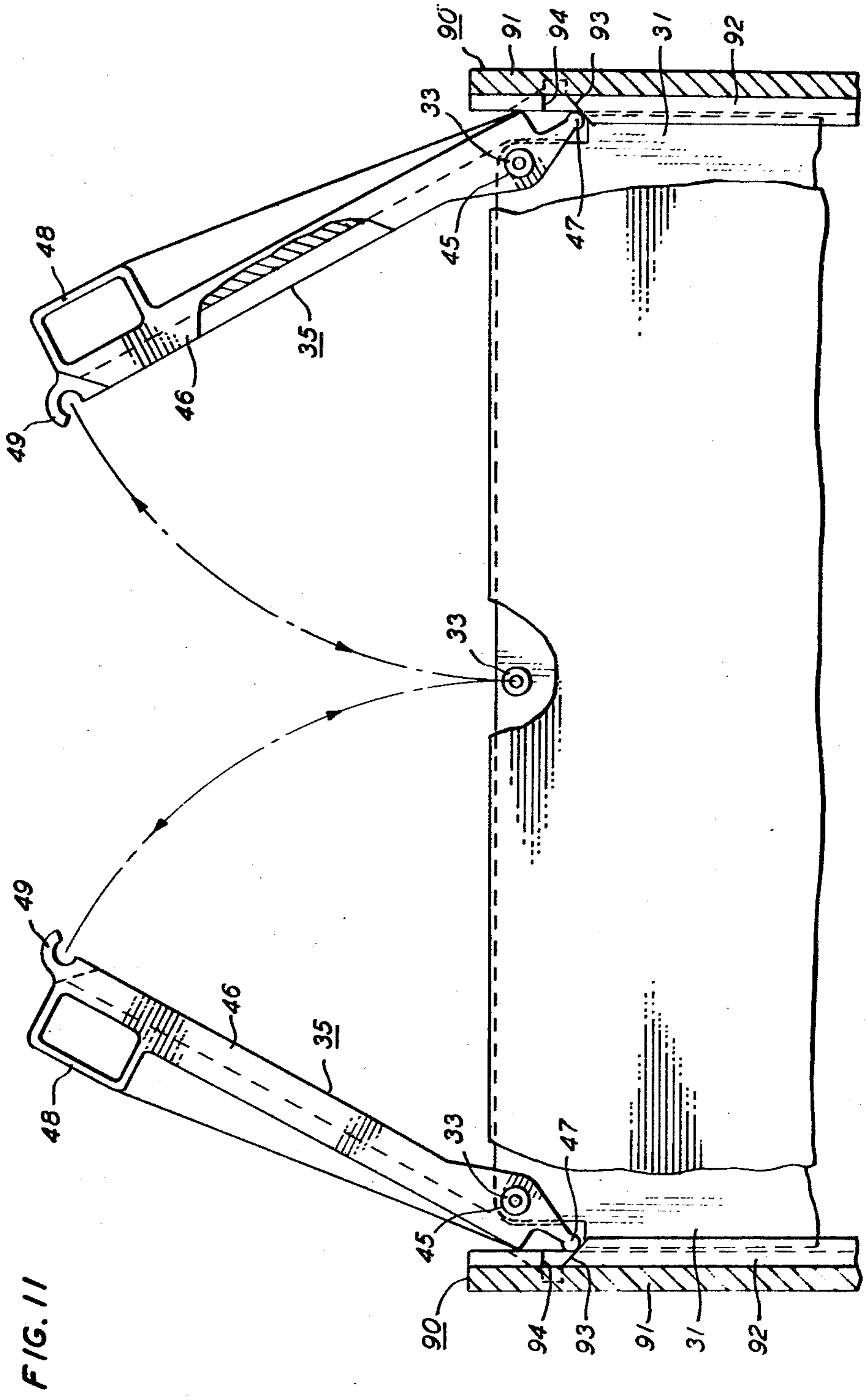
FIG. 11 is an exterior plan view taken partially in section of a portion of the ferreed switch shown in FIG. 4.

The lever arms 35 assist in inserting and removing the ferreed switch 20 when it is used in an operating environment. As shown in FIGS. 2, 4 and 11, a pair of lever arms 35 is mounted on the shunt plate assembly 30, and each is essentially identical to the other. Consequently, a description of one will suffice for both. As can be seen in FIG. 4, each lever arm 35 is effectively divided into two parts by an aperture 45. The aperture 45 accommodates a stand-off 33 and thus forms a pivot point for the lever arm 35. One part of the lever arm 35 contains a handle 46, while the other part contains a cam stop 47 which is conveniently cylindrical in construction. The handle 46 has finger grips 48 and, as best seen in FIG. 11, a locking hook 49 which cooperates with a stand-off 33. Specifically, the locking hook 49 is slightly larger than a semicircle. As a result, when it is pressed against a stand-off 33 it first expands and then snaps into place around the shaft thereof. As to the lever arms 35 as a whole, each is made of a plastic material such as polycarbonate.

Figure 5:
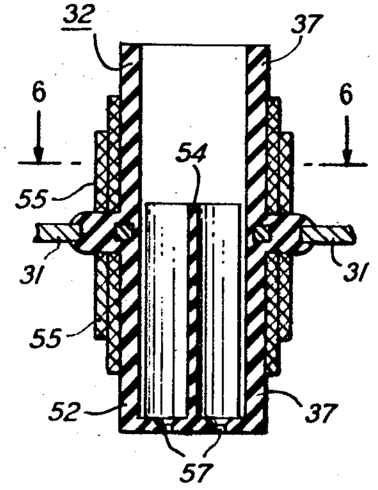
FIG. 5 is an elevation view of a partially constructed coil form taken in section.
Figure 6:
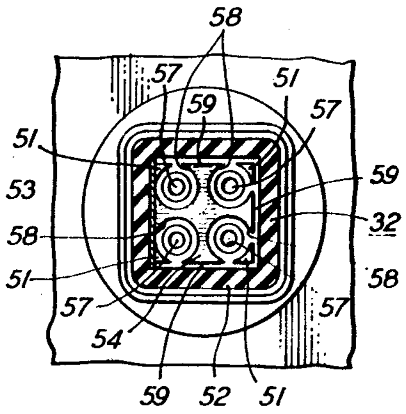
FIG. 6 is a plan view taken partially in section of the coil form shown in FIG. 5.
Figure 7:
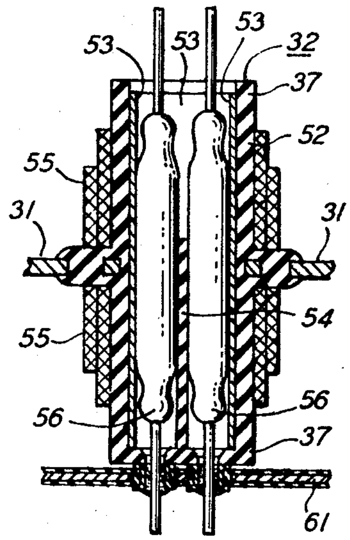
FIG. 7 is an elevation view taken partially in section of a coil form in combination with operative components at one step in the manufacturing process.

The coil forms 32 are coil supports which group the active switching components into crosspoint subassemblies or clusters. The coil forms 32 are all identical, so a description of one will suffice for all. As shown in FIGS. 5, 6 and 7, each coil form 32 includes a hollow support member 52. Each support member 52 includes the two end sections 37 and is advantageously made of a thermoplastic material. When assembled into a crosspoint cluster, the support member 52, as illustrated in FIGS. 5 and 7, includes corner guides 51, one or more remanent plates 53, a separator 54, a pair of coils 55, and one or more reed switches 56.

As shown in FIGS. 5 and 6, one end section 37 is sealed, except for holes 57, to form a floor from which the separator 54 and the corner guides 51 project upwardly. The holes 57 are designed to accommodate leads from the reed switches 56 and, in order to facilitate insertion of the lead, each is tapered. In the embodiment described, the separator 54 is similar in shape to a "Maltese" cross in cross section. As a consequence, it cooperates with the walls of the support member 52 to form a number of compartments 58. One hole 57 is located in each compartment 58. Similarly, the corner guides 51 are spaced from the walls of the support member 52 and cooperate in pairs with the separator 54, as best seen in FIG. 6, to form pockets 59. As can be seen from FIG. 6, when a coil form 32 is assembled, each compartment 58 can accommodate a reed switch 56 and each pocket 59 can accommodate a remanent plate 53. In the embodiment illustrated in FIGS. 1 and 2, however, only three reed switches 56 have been inserted in the compartments 58.

Figure 8:
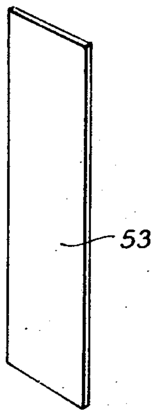
FIG. 8 is a perspective view of a magnetically remanent member.

The remanent plates 53 are made of a magnetic material having a substantially square hysteresis loop, so each exhibits a bistable magnetic state. Advantageously, they are made of a material such as Remendur and, as shown in FIG. 8, are conveniently formed in a rectangular shape. Functionally, the magnetic state of the remanent plates 53 responds to selective operation of the coils 55.

As shown in FIG. 6, when each remanent plate 53 is inserted in a pocket 59, it is prevented from rotating by the cooperative action of the corner guides 51 and the separator 54. Moreover, as can be seen best in FIG. 7, the floor of the sealed end of the support member 52 is spaced from the shunt plate 31 a distance such that the mid-point of each remanent plate 53 will be in register with the shunt plate 31. As a consequence, the support members 52 position the remanent plates 53 so that they are magnetically centered with respect to the reed switches 56.

Figure 13:
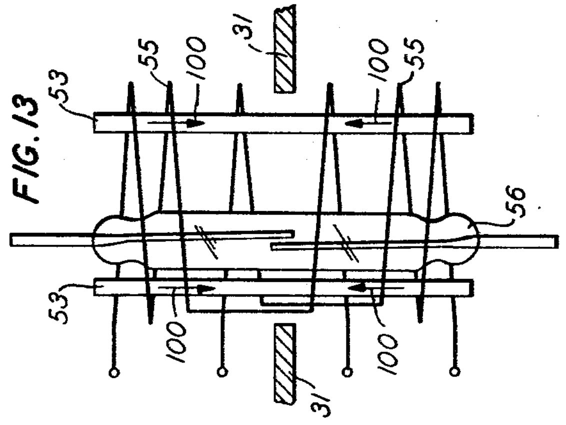
FIG. 13 is the same as FIG. 12 except that it illustrates another mode of operation.
Figure 12:
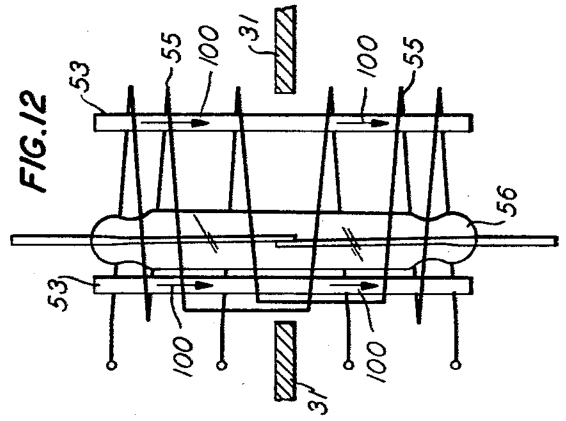
FIG. 12 is a conceptualized arrangement of the operative components of a ferreed switch in which one mode of operation is illustrated.

The coils 55 are wound on the support members 52, and, as conceptually illustrated in FIGS. 12 and 13, each coil 55 comprises a primary and secondary winding. In practice, the primary winding advantageously has approximately twice the turns of the secondary; i.e., the primary having thirty-five turns and the secondary having eighteen. Moreover, the primary and secondary windings are connected in series, but wound so as to generate opposing magnetic flux. Each coil 55 is wound on its support member 52 with the primary wound on one end section 37 and the secondary wound on the other. Also, two coils 55 are wound on each support member 52, but with the primaries wound on opposite end sections 37. Thus, each end section 37 will be wound with a primary and a secondary winding, but the windings will be from different coils. Consequently, each support member 52 accommodates two differentially wound coils 55.

When the coil forms 32 are assembled in the shunt plate assembly 30, the primary windings of four coils 55 in each quadrant row located on one side of the shunt plate 31 are wired together to form a series string. Similarly, the corresponding four secondary windings in the same quadrant row but located on the other side of the shunt plate 31 are also wired together to form a series string. Next, the two strings are joined. Specifically, one end of the string of primary windings and one end of the string of secondary windings in each quadrant row are joined to opposite ends of a common pass-through pin 38 so as to form a single series circuit containing both primary and secondary windings. The remaining input and output leads of the series circuit of primary and secondary windings so formed are then terminated on two terminal pins 42. When wound with this winding arrangement, the shunt plate assembly 30 has sixteen individual rows of series wound coil forms 32 in which each individual row contains four coil forms 32 and the sixteen rows are arranged in four equal quadrants.

The column quadrants are wired in the same manner as the row quardrants; that is, the primary windings of four coils 55 in each quadrant column located on the other side of the shunt plate 31 are wired in a series string as are the corresponding secondary windings. As before, the string of primary windings and the string of secondary windings are joined at one end by another common pass-through pin 38, and the remaining lead ends are terminated on two additional terminal pins 42. Consequently, electrical access to any two coils 55 wired on a common support member 52 is through four specific terminal pins 42; two being associated with a specific column in a quadrant and two being associated with a specific row in the same quadrant.

In the embodiment being described, the terminals 42, as well as the reed switches 56, are reached electrically through the two circuit boards 60 and 70. As partially illustrated in FIG. 1, the circuit board 60 is an assembly comprising a conveniently rectangular printed circuit board 61, a number of circuit paths 62 and a connector plug 86. The connector plug 86 is mounted at one end of the printed circuit board 61 and is joined electrically to the circuit paths 62. It is designed to be plugged into a suitable socket as described elsewhere.

The printed circuit board 61 is advantageously designed to function as a so-called strip line. As can best be seen in FIG. 9, it contains an electrically conducting plate 83, the circuit paths 62, a dielectric material 84 and a ground screw 85. The plate 83 is conveniently made of a material such as aluminum, while the dielectric material 84 is made from an epoxy resin and is located between the circuit paths 62 and the metal plate 83. The metal plate 83 serves a dual function; first, it acts as a ground plane with respect to the circuit paths 62, and second, it acts as a rigid support. In addition, it can be made of a magnetically conducting material as well as an electrically conducting material. In that case it will provide a third function; viz, it will act as a magnetic shield with respect to the shunt plate assembly 30.

Figure 9:
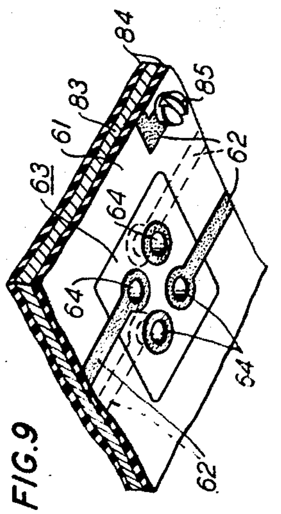
FIG. 9 is a partial view taken in perspective of a portion of a printed circuit board containing a window and mounting tabs.

The screw 85 grounds the plate 83. It is conveniently self-tapping and, when screwed into the printed circuit board 61, the threads engage the plate 83. As illustrated in FIG. 9, its head engages a circuit path 62 which, in turn, extends through the connector plug 86 to a suitable ground (not shown).

Figure 16:
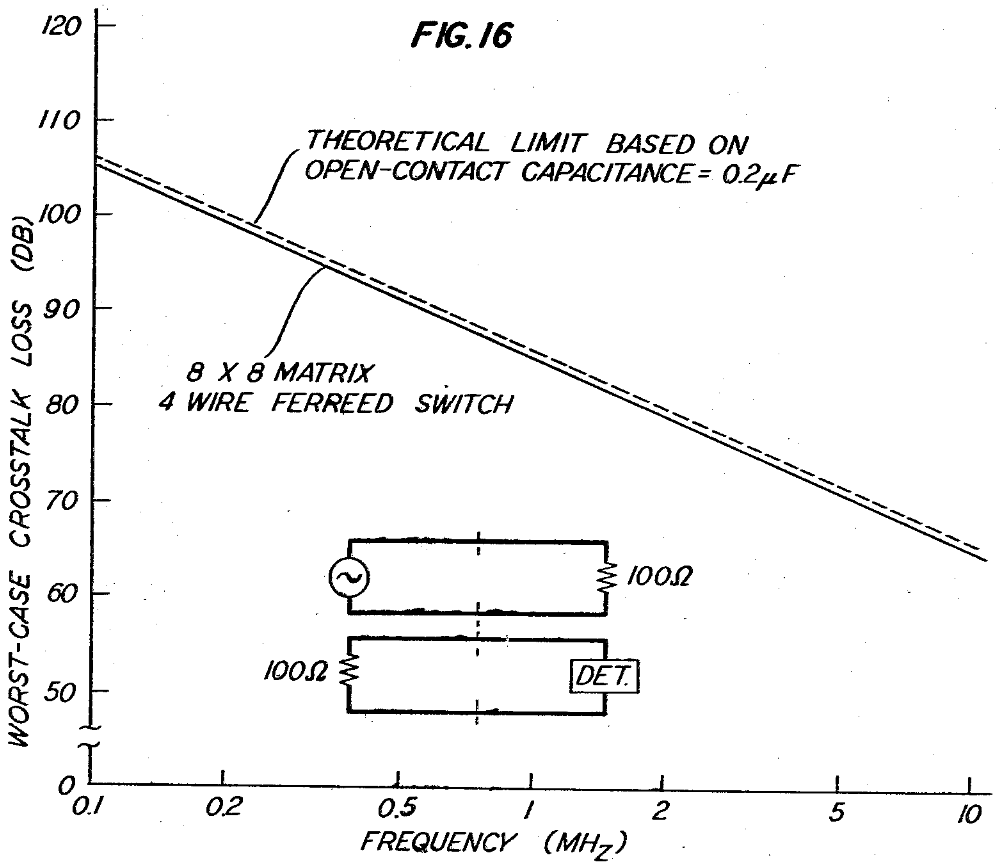
FIG. 16 is a diagram illustrating worst case crosstalk loss in DB's as a function of frequency in megahertz.

It has been found that when the circuit board 60 functions as a strip line, a substantial improvement is achieved in cross-talk loss. In fact, as shown in FIG. 16, a switch equipped with printed circuit boards functioning as strip lines performs almost at the limit theoretically imposed by open contact capacitance. The lowest tolerable db loss for communication equipment is about 80 db. Consequently, as can be seen from FIG. 16, the disclosed switch can be used with signals up to the one megahertz range. Moreover, when functioning as a strip line, the circuitry is susceptible to transmission line design treatment and the switch is capable of working compatibly with coaxial input and output equipment.

Figure 10:
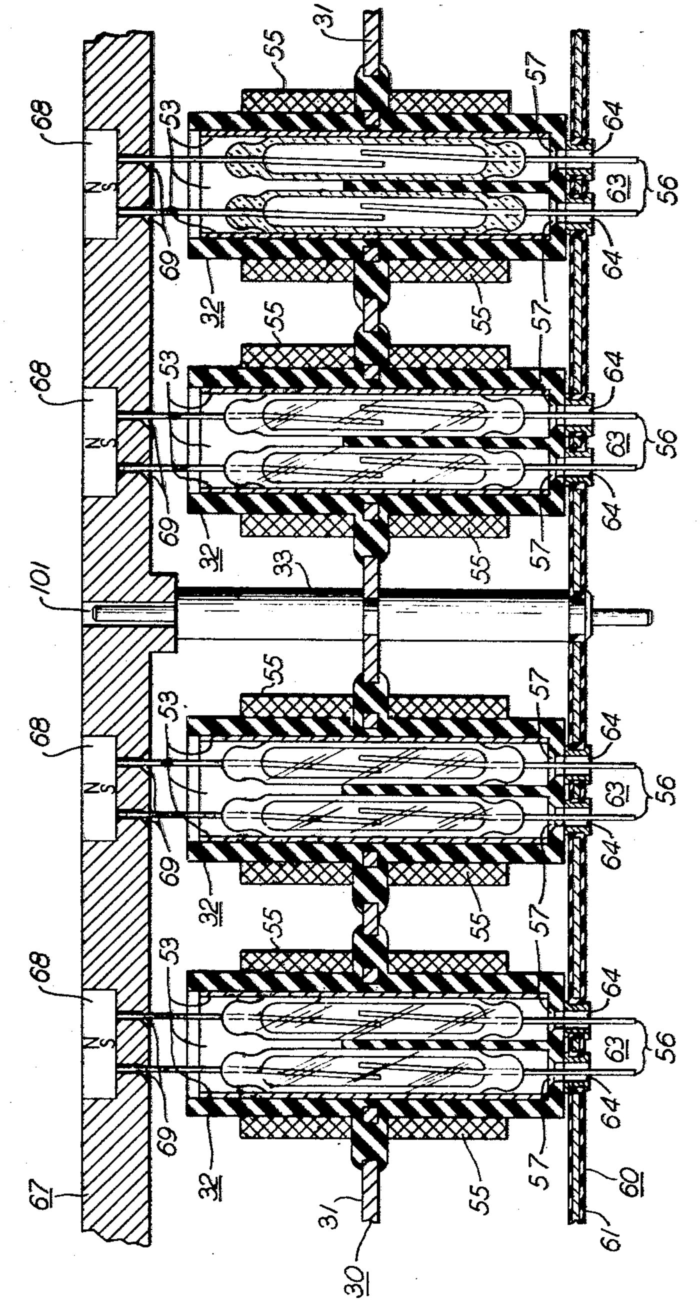
FIG. 10 is an elevation view taken partially in section of a portion of a ferreed switch during one phase of assembly.

Returning to FIGS. 3, 9 and 10 and the detailed construction of the printed circuit board 61, it also contains sixty-four hole sets 63, a number of mounting holes 65 and a number of terminal pin holes 66. The hole sets 63 are arranged in a symmetrical array of rows and columns. As illustrated in FIGS. 3, 9 and 10, each hole set 63 includes a number of lead holes 64, and each lead hole 64 is associated with a circuit path 62.

As can be understood from FIG. 3, the terminal pin holes 66 are arranged in two rows of sixteen each (not shown) at one end of the printed circuit board 61, and the mounting holes 65 are distributed around the periphery and in the center of the printed circuit board 61 (not shown). The mounting holes 65 hold the printed circuit board 61 to the stand-offs 33, the terminal pin holes 66 accept terminal pins 42, and each terminal pin hole 66 is associated with a circuit path 62 (not shown). When the printed circuit board 61 is joined to the stand-offs 33, as partially illustrated in FIGS. 3 and 10, the hole sets 63 are aligned with the ends of the coil forms 32 and each lead hole 64 is in register with a lead hole 57.

During fabrication of the ferreed switch 20, as best illustrated by FIG. 10, the lead holes 57 and 64 cooperate to facilitate assembly. Assembly conveniently begins by mounting the coil forms 32 on the shunt plate 31.

Next, the coils 55 are wound on the coil forms 32 and the ends are wired to appropriate terminals 42 and pass-through pins 38 to form the wiring pattern described elsewhere.

After the coils 55 are wound and terminated, the circuit board 60 is installed on the shunt assembly 30 with the terminal pins 42 projecting through the holes 66, and the stand-offs 33 extending through the holes 65. When the circuit board 60 is properly located on the shunt plate assembly 30, the stand-offs 33 are staked to the printed circuit board 61 to hold it in place.

With the circuit board 60 in place, the reed switches 56 and the remanent plates 53 are inserted in the compartments 58 and pockets 59 in the coil forms 32. When a reed switch 56 is inserted into a compartment 58, the taper in the lead hole 57 guides its lead and, because the lead hole 57 is in register with the lead hole 64, directs it into the lead hole 64 in the circuit board 60. Similarly, the remanent plates 53 in each coil form 32 are guided into the pockets 59 by the corner guides 51 and separator 54, and centered with respect to the shunt plate 31 by the floor of the support members 52. From the foregoing, it is readily seen that the design of the coil forms 32 makes insertion and position of the reed switches 56 and the remanent plates 53 a simple matter. In fact, when each is merely dropped, it falls into place, an operation that can be done rapidly and easily by an unskilled operator or even a machine.

Next, all of the reed switches 56 are located in unison with respect to the shunt plate 31. As best seen in FIG. 10, a magnetic positioning jig 67 is used to simultaneously locate the reed switches 56. The jig 67 comprises sixty-four magnets 68 and a number of lead locating holes 69. The magnets 68 are located in the jig 67 with their faces in a common plane and in abutting relationship with one end of the lead locating holes 69. Moreover, the magnets 68 are aligned in rows and columns so that one magnet appears at each intersection.

The lead locating holes 69 are large at one end but each tapers down to an opening just large enough to accommodate the lead from a reed switch 56. In addition to the lead locating holes 69, the jig 67 also has a number of positioning holes 101. The positioning holes 101 accommodate the ends of the stand-offs 33, and, when the jig 67 is mounted on the stand-offs 33, align each magnet 68 in register with a coil form 32.

After the jig 67 is in position on the stand-offs 33, the lead tips on the reed switches 56 are magnetically attracted into the lead locating holes 69, where they are straightened if necessary, and become attached to the faces of the magnets 68. The reed switches 56 are made so that the distance between the lead tips and the airgap, or point of overlap between the reeds, is a precise distance. Consequently, when all of the lead tips are attached to the faces of magnets 68, they will all be aligned in a common plane. Similarly, the stand-offs 33 project a carefully controlled distance above the shunt plate 31. As a result, the plane containing the lead tips is spaced a precise distance from the shunt plate 31; that is, a distance such that the airgaps in the reed switches 56 are aligned with the shunt plate 31. Moreover, the lead locating holes 69 are spaced with respect to the positioning holes 101 so that when a lead from a reed switch 56 is positioned therein, the lead will be aligned laterally on a specific longitudinal axis and ready to be inserted into the circuit board 70.

With the leads properly aligned, both laterally as well as longitudinally, the reed switches 56 are permanently attached to the printed circuit board 60. Specifically, the leads in the lead holes 64 and the terminal pins 42 in the terminal pin holes 66 are soldered to the printed circuit board 61 and thereby joined to specific circuit paths 62. Also, the remanent plates 53 are jointed to the coil forms 32 as, for example, by staking. At this point, the circuit board 60 is joined to the shunt plate assembly 30, the reed switches 56 are fixed in position and only the circuit board 70 remains to be mounted in order to complete assembly of the electrically operative part of the ferreed switch 20.

As best seen in FIGS. 1, 2 and 3, the circuit board 70 is mounted by attaching the projecting leads of the reed switches 56 to apertured tabs 71, projecting the terminal pins 42 through terminal pin holes 72, soldering the terminal pins 42 in place, extending the stand-offs 33 through mounting holes 73, and staking the stand-offs 33 in place. Structurally, as best seen in FIGS. 2 and 3, the circuit board 70 is an assembly comprising, in addition to the tabs 71, the terminal pin holes 72 and the mounting holes 73 already mentioned, a printed circuit board 74, sixty-four windows 75, a connector plug 76 and a plurality of circuit paths 77 electrically joined to the terminal pins 42. The tabs 71, the terminal pins 42 and the mounting holes 73 are located with respect to each other so that when the stand-off 33 are aligned with the mounting holes 73, each aperture in a tab 71 will be laterally aligned directly over the specific longitudinal axis of a lead from a reed switch 56 and each terminal pin 42 will be aligned with a terminal pin hole 72. Thus, installation of the circuit board 70 is simply a matter of aligning the mounting holes 73 with the stand-offs 33 and then dropping the printed circuit board 74 into place.

Figure 14:
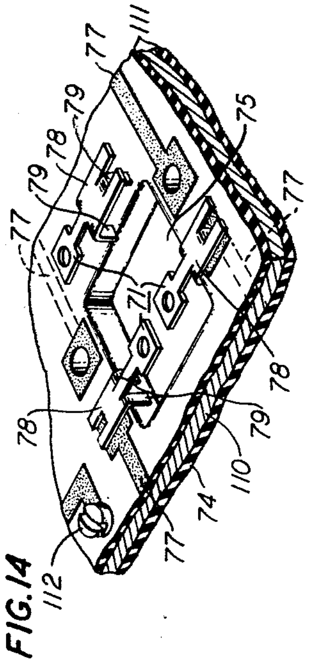
FIG. 14 is a partial view taken in perspective of a portion of a printed circuit board containing a hole set.

As in the case of the printed circuit board 61, the printed circuit board 74 is also constructed as a strip line. As seen in FIG. 14, it comprises a metal plate 110 and the circuit paths 77 separated by a dielectric material 111. In addition, it includes a ground screw 112 which functions in the same manner as its counterpart in the circuit board 60. Advantageously, the metal plate 110 is made from aluminum, the dielectric material 111 is an epoxy resin and and the ground screw 112 is self-tapping. Again, as in the case of the circuit board 60, the metal plate 110 can be made of a magnetically as well as electrically conducting material for shielding purposes.

Advantageously, the connector plug 76 is located at the end of the printed circuit board 74 and, as can be seen in FIG. 1, is in register with the connector plug 86 when the circuit board 70 is installed. The connector plugs 76 and 86 join the ferreed switch 20 to a socket as described hereafter. While the connector plugs 76 and 86 are particularly convenient, alternative arrangements are also useful. For example, as indicated in FIG. 15, the connector plugs 76 and 86 can readily be replaced with a wire wrap terminal assembly 105.

Figure 15:
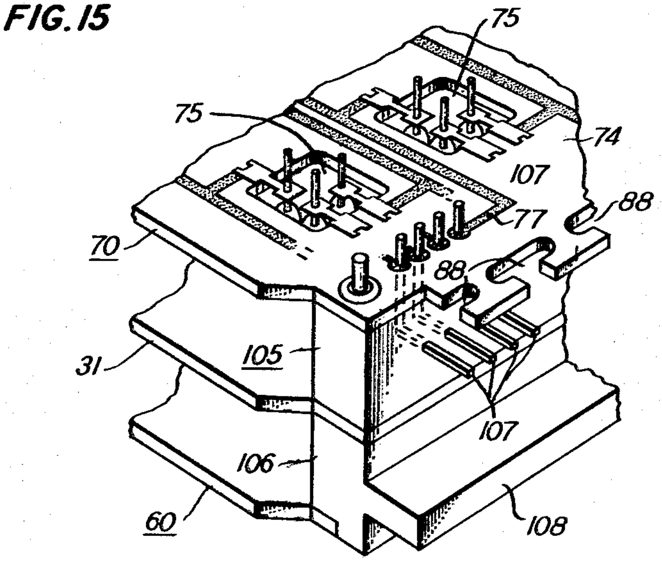
FIG. 15 is a partial view taken in perspective of a ferreed switch having wire wrap terminals and a fanning strip.

As partially shown in FIG. 15, the wire wrap terminal assembly 105 comprises a terminal block 106 made of a phenolic material and terminals 107 conveniently made from tin-plated brass. Each terminal 107 is L-shaped and is mounted with one end projecting upwardly through a suitable hole in the printed circuit board 74 so as to contact a circuit path 77 while the other end projects out of the terminal block 106 and is adapted for automatic wire wrapping.

When the ferreed switch 20 is equipped with a wire wrap terminal assembly 105, as shown in FIG. 15, it is especially adapted to protect external circuit leads terminated on the terminals 107. Specifically, the printed circuit board 74 is modified to include openings 88 arranged so that the edge of the circuit board 61 forms a fanning strip. In addition, the terminal block 106 includes a projecting ridge 108 which, in conjunction with the fanning strip on the circuit board 74, forms a space. The terminals 107 are tucked in the space and are thereby protected from accidental injury.

Returning to the description of the printed circuit board 74, as best understood from FIG. 2, the windows 75 are distributed in eight intersecting rows and columns. Each window 75 is located at an intersection of a row and column and, when the circuit board 70 is attached to the shunt plate assembly 30, is in register with a coil form 32. In addition, each window 75 has an opening large enough to accommodate all of the leads from the reed switches 56 in the associated coil form 32 and, in fact, is large enough to permit passage of an entire reed switch 56.

At each window, as best seen in FIG. 14, the tabs 71 are cantilevered outwardly over the opening from a point of attachment on a circuit path 77 on the printed circuit board 74. The tabs 71 are identical, so a description of one will suffice for all. Each tab 71 is made of an electrically conducting flexible material such as soft tin-plated brass. Advantageously, it has a rectangular section 78 at one end containing three flaps 79. Two of the flaps 79 are designed to engage a common side of a window 75 when installed, while the third is offset so as to cooperate with the others and a hole in the printed circuit board 74 to form a triangular point of attachment. At the other end of the tab 71 is an aperture to accommodate a lead from a reed switch 56 as described heretofore. Because of the flexibility of the tab 71, it can deflect to relieve any mechanical stress applied to the reed switch lead even after it has been soldered in place.

Assembly of the ferreed switch 20 is completed when the shunt plate assembly 30 is joined to the two circuit boards 60 and 70 and the combination is housed in a protective cover assembly 80. As best seen in FIGS. 1 and 3, the cover assembly 80 comprises two cover halves 81. Each cover half 81 has locating holes adapted to mate with the ends of selected stand-offs 33, and a central opening (not shown). A screw (not shown) extends through each central opening and engages a central standoff 33 to hold each cover half 81 in place on the shunt plate assembly 30. Both cover halves 81 have bent-over edges 120 and are made of a magnetically conducting material such as cold-rolled steel. As a consequence, they cooperate to physically protect and magnetically shield the internal components of the ferreed switch 20.

In addition, the cover halves 81 cooperate with shunt plate 31 and the lever arms 35 to assist during installation or removal of the ferreed switch 20. As shown in FIG. 1, a space 121 appears between the bent-over edges 120 of the two cover halves 81 in which one edge of the shunt plate 31 is exposed. The space 121, the edge of the shunt plate 31, and the cover halves 81 cooperate with parts of a mounting structure 90 during installation.

The mounting structure 90, as partially shown in FIGS. 4 and 11, includes a support 91 and a pair of tracks 92. Each track 92 flanges outwardly from the support 91 and is grooved. A cam stop 93 is located at one end of each track 92 as well as a cam surface 94. Adjacent to the end of the tracks 92 is a connector socket 96 for accepting the connector plugs 76 and 86.

When the ferreed switch 20 is inserted in the mounting structure 90, the cover halves 81 embrace the tracks 92 and guide two edges of the shunt plate 31 into the respective grooves. After the ferreed switch 20 has been inserted into the mounting structure 90 a predetermined distance, viz, to a point before the connector plugs 76 and 86 engage the connector socket 96, the cam stop 47 on each lever arm 35 engages the cam stop 93. As a consequence, no further free inward travel of the ferreed switch 20 is permitted and the connector plugs 76 and 86 cannot be inadvertently jammed into the connector socket 96. Thereafter, the lever arms 35 must be used to seat the connector plugs 76 and 86 the remaining distance into the connector socket 96. Specifically, the lever arms 35 are pivoted by the handles 46 so that the cam stops 47 press on the cam surfaces 94 and thereby force the connector plugs 76 and 86 into the connector socket 96. Consequently, the lever arms 35 serve a dual function: first, they prevent accidental damage to the connector plug 76, the connector plug 86, and the connector socket 96, and secondly, they insert the connector plugs 76 and 86 in the connector socket 96 with a positive action.

In operation, a ferreed switch is typically energized by applying coincident pulses to the two coils located at a selected crosspoint. The ferreed switch 20 disclosed herein generally operates in the same manner. As shown in FIGS. 12 and 13, the primaries of the coils 55 are illustrated graphically by two coil turns, while the secondaries are shown as a single coil turn. Moreover, the primary and secondary in each coil 55 are connected to generate opposing magnetic fluxes. However, since the primary has more turns than the secondary, each coil 55 will generate a net magnetic flux, and the net magnetic flux will have a magnitude equal to the difference between the magnetic flux from the primary and the magnetic flux from the secondary.

Each pair of arrows 100 in FIGS. 12 and 13 on the same side of the shunt plate 31 represent a net magnetic flux. In FIG. 12, the two coils 55 have been energized coincidentally. As a result, two aiding net magnetic fluxes have been induced in the remanent plates 53 and four arrows 100 are shown. The two induced net magnetic fluxes combine to form a resultant magnetic flux.

Each reed switch 56 is adjusted to operate in response to flux having a magnitude in excess of either net magnetic flux. As a result, the contacts in each reed switch 56 will close in response to the resultant flux because the resultant magnetic flux has a magnitude equal to the sum of the two net magnetic fluxes. The contacts will remain closed until the magnetic state of the remanent plates 53 is changed.

In FIG. 13, the magnetic state of the remanent plates 53 has been changed. Specifically, a pulse has been applied to only one of the coils 55 and in a direction so as to produce an opposing net magnetic flux. Thus, two of the flux arrows 100 have changed direction. As a consequence, the resultant magnetic flux in the reed switch 56 drops below the magnitude required to hold the contacts closed. As a result, the contacts have opened.

While electrical operation of the ferreed switch 20 described above is conventional, the structure of the disclosed device allows several circuit efficiencies. Generally, in order to coincidentally operate both coils 55 at a crosspoint, one pulse is applied to a selection row and another is applied to a selected column of coil forms 32. Since input to the coils 55 in the selected row and column is through two pairs of terminal pins 42, it would appear that two pulses are necessary. With the design disclosed, however, one of the circuit paths 62 or 77 on the circuit boards 60 or 70 interconnects one selected terminal pin 42 from each pair. By this technique, a column and row of coils 55 are automatically wired in series when the appropriate circuit board is mounted. Consequently, only a single pulse need be applied through the remaining two terminal pins 42 in order to operate the selected crosspoint. Similarly, it will be readily apparent that many different crosspoint arrays can easily be obtained merely by suitably arranging the circuit paths on the circuit boards 60 or 70. As a consequence, a shunt plate assembly 30 wired in a standard pattern can be adapted to a variety of switching functions simply by equipping it with suitably designed printed circuit boards.

In addition to the foregoing advantages, the disclosed design improves maintenance procedures. For example, the tabs 71 in each window 75 are designed to be easily separated from the reed switch leads in order to expose the reed switches 56 in the underlying coil form 32. After a tab 71 has been detached, it is a simple matter to unsolder the remaining lead of a defective reed switch 56, remove it, and replace it with one that is not defective. As a result, maintenance can be efficiently performed.

In summary, therefore, a ferreed switch design has been disclosed herein which facilitates manufacture, alleviates structural difficulties, improves maintenance procedures, improves operating characteristics and reduces handling problems when placed in service. While only one embodiment has been disclosed, it is to be understood that it merely exemplifies the principles of the invention and many other embodiments falling within the spirit and scope of the invention will readily occur to others skilled in the art.

What is claimed is:

1. In a method of fabricating a switching assembly comprising a shunt plate assembly having a shunt plate and coil forms for accommodating switch units, a plurality of elongated switch units having leads projecting from both ends and a conductor board perforated with lead holes, the steps comprising:

attaching a conductor board to one side of said shunt plate assembly;

inserting said switch units into coil forms in said shunt plate with the leads at one end extending through lead holes in said conductor board;

magnetically aligning the tips of leads projecting from the other end of said switch units in a common plane, said common plane being parallel to and spaced a predetermined distance from a plane containing said shunt plate; and rigidly attaching said switch units to said conductor board whereby the position of said switch units with respect to said shunt plate is permanently fixed.

2. A method of fabricating a switching assembly comprising the steps of:

assembling coil forms, stand-offs and terminal blocks on a flat shunt plate;

wrapping coils on said coil forms and joining said coils to terminals on said terminal blocks;

positioning a first circuit board on one side of said stand-offs and fixing said first circuit board in place;

inserting switch units into holes in said coil forms and said first circuit board;

positioning said switch units in unison within said coil forms in predetermined positions with respect to said shunt plate;

fixedly attaching said leads on said switch units to first circuit board;

rigidly attaching said first circuit board to said stand-offs and terminals on one of said terminal blocks;

locating terminals on the other of said terminal blocks in holes in a second circuit board and switch leads in tabs on said second circuit board;

positioning said second circuit board on said stand-offs and fixing said second circuit board rigidly in place; and affixing said second printed circuit board to said terminals and said tabs to said leads.

3. The method of fabricating a reed switch assembly in accordance with claim 2 wherein said switch units are positioned by aligning lead tips at one end in a common plane.

4. The method in accordance with claim 3 wherein said lead tips are aligned in said common plane magnetically.

References Cited

UNITED STATES PATENTS

| | | | |
|---|---|---|---|
| 3,269,805 | 8/1966 | Evans | 29—626 |
| 3,375,576 | 4/1968 | Klein | 29—626 |
| 3,424,854 | 1/1969 | Baxter | 29—626 |
| 3,427,715 | 2/1969 | Mika | 29—626 |

JOHN F. CAMPBELL, Primary Examiner

D. P. ROONEY, Assistant Examiner

U.S. Cl. X.R.

29—630